United States Patent [19]

Pokrowsky et al.

[11] Patent Number: 5,917,321

[45] Date of Patent: *Jun. 29, 1999

[54] PROCESS AND DEVICE FOR DETERMINING THE MAGNETIC CHARACTERISTICS OF THIN MAGNETIC LAYERS

[75] Inventors: Peter Pokrowsky; Heinz Lehr, both of Mainz; Hans-Joachim Hartmann, Wiesbaden; Christoph Schulz, Mainz, all of Germany

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/776,476

[22] PCT Filed: May 19, 1995

[86] PCT No.: PCT/EP95/01908

§ 371 Date: Jan. 17, 1997

§ 102(e) Date: Jan. 17, 1997

[87] PCT Pub. No.: WO96/36887

PCT Pub. Date: Nov. 21, 1996

[51] Int. Cl.$^6$ .......................... G01R 33/12; G01N 27/72
[52] U.S. Cl. ........................ 324/235; 324/210; 324/223; 324/226; 324/228; 324/239; 324/262
[58] Field of Search ................................. 324/210, 212, 324/222, 223, 225–231, 235, 239, 240, 261, 262

[56] References Cited

U.S. PATENT DOCUMENTS

| | | | |
|---|---|---|---|
| 2,901,691 | 8/1959 | Forster | 324/34 |
| 3,922,599 | 11/1975 | Steingroever et al. | 324/232 X |
| 4,465,975 | 8/1984 | Porter | 324/200 |
| 4,618,823 | 10/1986 | Dahlheimer et al. | 324/232 X |
| 4,816,761 | 3/1989 | Josephs | 324/212 |
| 4,843,316 | 6/1989 | Hesterman | 324/210 |
| 4,849,694 | 7/1989 | Coates | 324/226 X |
| 4,901,016 | 2/1990 | Kusatani et al. | 324/210 |
| 5,041,785 | 8/1991 | Bogaerts et al. | 324/207.24 |
| 5,136,239 | 8/1992 | Josephs | 324/210 |
| 5,155,433 | 10/1992 | Allen, III et al. | 324/205 |
| 5,527,377 | 6/1996 | Miwa et al. | 324/226 X |
| 5,629,620 | 5/1997 | Jeffers et al. | 324/210 |

FOREIGN PATENT DOCUMENTS

| | | | |
|---|---|---|---|
| 2522520 | 2/1977 | Germany | G01R 33/04 |
| 4343686 | 8/1994 | Germany | G01R 33/12 |
| 4-60477 | 2/1992 | Japan | 324/235 |

OTHER PUBLICATIONS

Research Disclosure Mar. 1990 "External H Field Source with Magnetic Head Readback for Measurement of Disk Bulk Magnetic Properties" No. 311, New York U.S.

IBM TDB vol. 36 No. 06A Jun. 1993 "Scanning Microspot Kerr Looper for High–Coercivity Materials" by M. Re et al, pp. 75, 76.

(List continued on next page.)

*Primary Examiner*—Gerard Strecker
*Attorney, Agent, or Firm*—G. Marlin Knight

[57] ABSTRACT

A process is presented for the direct determination of characteristic magnetic values of thin magnetizable layers, in which an element creating a magnetic field creates the magnetization of a part surface in such a way that the thin magnetizable layer, the element creating the magnetic field, and a magnetic field sensor are located in a relative position of rest to one another. The magnetic field sensor is then positioned opposite the magnetized part surface by a relative movement of the element creating the magnetic field, the magnetic field sensor, and the thin magnetic layer. During the subsequent measurement of the magnetization of the part surface, the thin magnetic layer, the element creating the magnetic field, and the magnetic field sensor are in a relative position of rest to one another. During the process of magnetization of the part surface, and during the measurement of the magnetization of this part surface, the element creating the magnetic field and the magnetic field sensor are spatially separated from one another.

13 Claims, 2 Drawing Sheets

OTHER PUBLICATIONS

IBM TDB vol. 35 No. 3 Aug. 1992 "Time Domain Method of Measuring High Frequency Magnetic Resonance" by M. Brady et al, pp. 122, 123.

IBM TDB vol. 34 No. 4B Sep. 1991 "Read/Write Magneto–Optic Structure With Improved Reflective/Capping Layer" by V. Brusic, pp. 444, 445.

IBM TDB vol. 33 No. 3B Aug. 1990 "New Rotating Field Methods to Measure the Easy Axis Orientation and Anisotropy Field of Thin Ferromagnetic Films" by J. Best et al, pp. 264, 265.

IBM TDB vol. 27 No. 1A Jun. 1984 "High Resolution Dynamic Magnetic Domain Readout" E. Kay et al, pp. 317–320.

IBM TDB vol. 19 No. 4 Sep. 1976 "Nondestructive Low–Noise Measuring of Magnetic Properties of Magnetic Storage Media" J. Schneider et al, pp. 1296, 1297.

IBM TDB vol. 15, No. 6 Nov. 1972 "Rotating Head Magneto–Optic Station" by A. Juliana, Jr., pp. 1790, 1791.

IBM TDB Sep. 1970 "Measuring Magnetic Fields From Recording Heads" by R. Comstock et al, pp. 1006, 1007.

"Transfer Curve Magnetometer", IBM Technical Disclosure Bulletin, vol. 24, No. 11B, pp. 6209–6210, Apr. 1982.

PROCESS AND DEVICE FOR DETERMINING THE MAGNETIC CHARACTERISTICS OF THIN MAGNETIC LAYERS

FIELD OF THE INVENTION

The present invention relates to a measurement process for the determination of the magnetic parameters of thin layers. It also relates to a device for carrying out this process.

BACKGROUND OF THE INVENTION

Thin magnetisable layers are currently used on an industrial scale mainly for the purpose of magnetic data storage. Since they are in general not self-supporting, they are applied to a suitable layer carrier. During this-stage of manufacture, the magnetic properties of the thin layers must be measured by way of a quality control.

Depending on the method of use and the physical principle of the recording and reproduction process, it may be required, in extreme cases, that the complete hysteresis loop must be determined. Occasionally it is sufficient to know the characteristic values of the hysteresis loop: Coercive field strength Ho, residual magnetism Mat, and squareness S'.

One of the most frequently-used methods of measurement is based on the exploitation of the induction law (Faraday's Law):

$$U = c\, dF/dt$$

where U=induced electrical voltage, c=const., and F=magnetic flux. In this situation, in the first instance, a part surface of the layer is magnetised by means of a variable external magnetic field H. This magnetisation is achieved in most cases by what is referred to as a magnetic head, which, depending on the application, allows for a variable magnetic field strength H to be created either perpendicular to or parallel to the layer.

The strength of the magnetic induction field B deriving from the magnetised layer, and therefore the magnetisation M, are measured in turn by means of a magnetic head. Its gap aperture is oriented in such a way that it forms the lowest possible resistance for the magnetic lines of force, which in practical terms are short-circuited and bundled in the magnetic head. The flux is sensed in this context by an induction coil. The value of the induced voltage then depends on the strength of the change in the flux.

An arrangement such as this is described in IBM TDB, Vol. 24, page 6209 f., April 1982. It features erasing, recording, and reading heads, which are mounted on a circular plate, which can be moved by a motor vertical to the plane of the magnetic plate which is to be investigated. During the test, the magnetic plate remains in a position of rest, and the magnetic heads are stroked across the specimen by the plates being set in rotation. A number of sections from the magnetic plate are tested, by means of the plate being moved further in a linear direction by a slide element.

The disadvantage with such an inductive (indirect), non-static measurement is that a high relative speed of test specimen and measuring head is required for a precision measurement, and that considerable damages result from an accident or from their coming in contact. Due to the proportional ratio between the induced voltage and the magnetic flux, and due to the relationship $F = c\int dA$; where c=const., B=magnetic induction, and dA=infinitesimal surface element, a dependency is derived between the measured signal and the magnetised surface.

In addition to this, a signal is obtained only at points of change of flux. Accordingly, this method is not very sensitive in relation to the value which is actually of interest, namely the magnetisation of the surface as a whole. In view of the fact that, as the recording field strength increases, so the transition area between "recorded" and "unrecorded" is "smeared" by feedover, and, in the case of a conductive substrate, by eddy currents, and the signal also has to be integrated, then in principle measuring errors can arise with this method of measurement.

It is therefore the task of the present invention to create a process and a device for the determination of the magnetic parameters of thin layers, in which the disadvantages outlined above can be avoided.

DETAILED DESCRIPTION OF THE INVENTION

Figure 1:
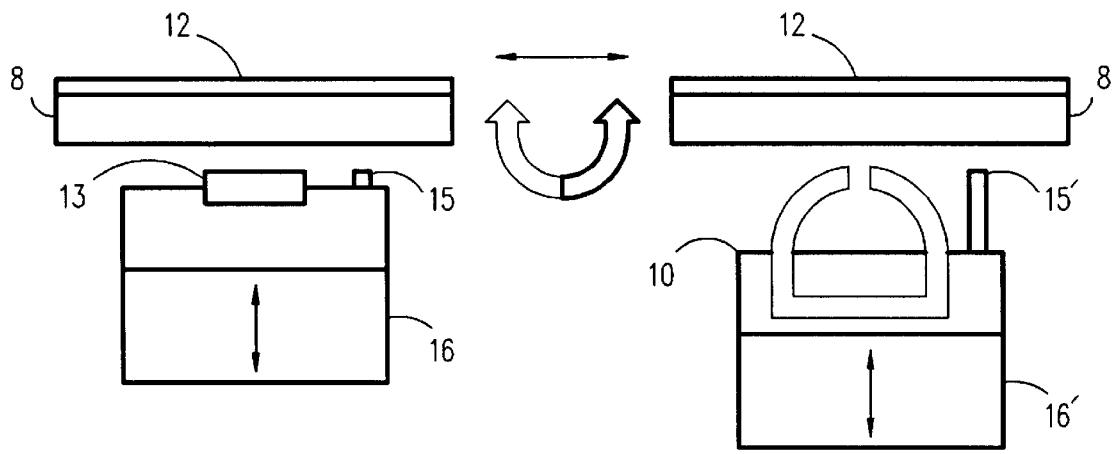
FIG. 1 illustrates the relationship between the sample, the magnetic head, the magnetic field sensor and the ranging sensor in an embodiment of the invention.

The present invention describes a direct measuring process for the determination of layer magnetisation, in which, during the magnetisation and measurement process, the specimen and the measurement system used for measuring the magnetisation are at rest relative to one another. The magnetisation of the layer, and the subsequent measurement of the magnetisation, are, however, carried out spatially separately in the present process. As a result of this, the possible influence of the residual field of an element inducing a magnetic field on the precision of the measurement can be minimised. As a result of the direct determination of the magnetisation of the specimen in the position of rest, no measurement signal integration is required, and the precision of the measurement depends solely on the sensitivity of the measurement system and the monitoring of the geometric parameters. In this context it is also possible to determine the characteristic magnetic values as a function of their location; i.e. lateral to various points of the magnetic layer.

The measurement process is designed in such a way that, initially, a part surface of a thin magnetisable layer is magnetised by an element which induces a magnetic field, such as a magnet head, an induction cup magnet or a horseshoe magnet, or a solenoid. This magnetised area, depending on the sensitivity of the magnetic field sensor used, as described hereinafter, can be so small in terms of surface, that the locational dependencies of the characteristic magnetic values, which occur as a result of the coating process for the application of the magnetisable layer may be measured.

Next, the magnetised part surface is positioned opposite the magnetic field sensor, with the result that the magnetisation and the measurement of this magnetisation is carried out at different locations, in other words, spatially separated.

The magnetisation of the layer which is created in the first step is then determined by means of the magnetic field sensor.

It is to be noted that a major feature of the measurement process described consists of the fact that, at every stage of the actual measuring process (i.e. at the moment of the magnetisation of the layer and the measurement of the field strength of the magnetised layer), no movement occurs between the magnetic layer, the element creating the magnetic field, and the magnetic field sensor, and that no dynamic field increase takes place either. This means that the element creating the magnetic field and the thin magnetic layer are located in a relative position of rest to one another during the actual measurement process. This can be achieved, for example, by the sensor or the layer carrier being moved to defined locations, which can be determined by position indicators (optical, inductive, interferometric, digital rotary transducers).

An essential factor for the measurement process is also the fact that, as already indicated earlier, the process for magnetisation and the measurement of the magnetic field created by this magnetisation, take place spatially separated from one another, since only then can the influence of residual fields be minimised.

If the magnetisation field is increased in several discrete stages with the measurement process described here, up until the saturation induction of the layer, the hysteresis loop of the thin magnetic layer can be measured. The number and density of the measured points determines the degree of precision which can be achieved for the characteristic curve of the hysteresis loop. An increase in the stray field, which occurs, for example, with an increase in the magnetic field when a magnetic head is being used, and the increase in the magnetised layer area which is associated with this, leads to an additional increase in the measured signal, but this can be numerically corrected by means of a simple model.

The magnetic field sensor used in the measurement stage described earlier can, for example, be a magneto-resistive sensor, a fluxgate sensor, a Hall sensor, or a magneto-optical sensor. These types of sensor feature a very high sensitivity to magnetic fields, and in this context are very simple to use. The devices known as SQUID sensors can also be used, but these have the disadvantage that they must be kept at a low temperature level by means of cooling devices. In general, sensors can be used which will allow for extremely small magnetic fields to be measured statically.

The process according to the invention is explained in greater detail below, on the basis of the drawings which outline the general structure of a measurement system to put into practice the process according to the invention.

Figure 4:
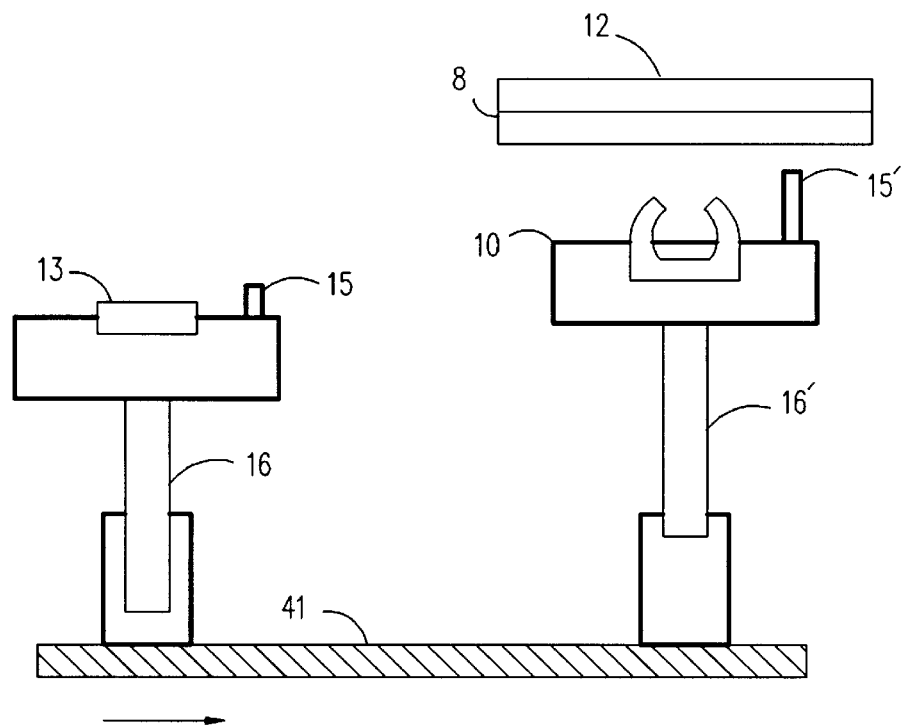
FIG. 4 illustrates the actuator for the magnetic head being extended while the actuator for the magnetic field sensor is retracted.

The field of an element 10, which creates a magnetic field (hereinafter referred to for simplicity only as the magnetic head), magnetises the thin layer in the area above the magnetic head gap i.e. a part surface of this layer, in the present case and without restriction to the general concept, parallel to the layer carrier 12. Next, the magnetic field of the magnetic head 10 is switched off, and a relative movement takes place between the specimen 8 on the one hand, and the magnetic head 10 and the magnetic field sensor 13 on the other, with the result that the part surface magnetised in the first stage is located opposite the highly-sensitive magnetic field sensor 13. This movement may take place in translational or rotational terms either by the movement of the measuring system (magnetic head 10 and magnetic field sensor 13), or of the specimen 8, consisting of the layer carrier 12 and the thin layer, indicated in the figure by the straight or curved double arrow. FIG. 4 illustrates the actuator 16' for the magnetic head being extended while the actuator 16 for the magnetic field sensor 13 is retracted. In this example, after the field is applied to the selected location on the magnetizable layer, the actuator 16' is retracted, the magnetic field sensor 13 is moved over the magnetizable layer and the actuator 16 is extended. In FIG. 4, the actuators 16, 16' are fixedly attached to a mounting plate 41 which is translatable. Accordingly, the external field strength of the magnetic layer is measured by the magnetic field sensor 13.

If it is intended that the complete hysteresis loop should be measured, the steps a) magnetisation, b) positioning, and c) measurement are repeated, in which context the magnetic field is increased in each case in discrete stages.

Figure 2:
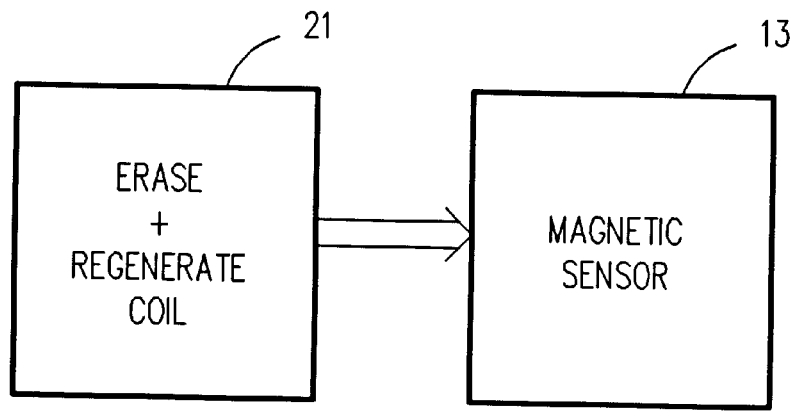
FIG. 2 illustrates the relationship between the magnetic sensor and the optional coil for erasing and regenerating a defined pre-magnetization value in the magnetic sensor.

In the event of magneto-resistive sensors or FLUXGATE sensors being used, they may be influenced by the high stray fields which occur during the process of magnetisation in such a way that the pre-magnetisation which is set when the sensors are manufactured is altered, and the offset voltage and characteristic curve of the sensors change accordingly. By the short-term application of a magnetic field perpendicular to the measuring device, it is accordingly possible in these cases to erase the "magnetic prehistory" of the ferromagnetic material (referred to as "regeneration"), and so set a defined and constant pre-magnetisation value. Both processes can be implemented by means of a coil arrangement 21, through which a current can be passed, to create a magnetic field at the location of the ferromagnetic sensor material (see FIG. 2). It is also possible for the two steps of regeneration and setting of the pre-magnetisation to be reversed.

The magnetisation of the layer can likewise be carried out perpendicular to the surface of the layer, by means of a suitable magnet. Magnetisation and measurement of the magnetic area by determining the external field strength can then be carried out in turn in the relative position of rest of the magnet, sensor, and layer.

Because of the strong dependency on the spacing of the magnetic head field, the distance between the magnetic head and the magnetisable layer can be measured with a high degree of precision by means, for example, of capacitive, inductive, or optical ranging sensors 15, 15'. Due to the fact that the magnetic field which is sensed by the magnetisation of the layer likewise features a high dependency on spacing, the distance between the magnetic field sensor 13 and the magnetisable layer can also be measured by such ranging sensors. Both the magnetic head and the magnetic field sensor are secured to actuators 16, 16' as well as the associated ranging sensor. The measured signal 31 (see FIG. 3) from the ranging sensors for measuring the distance between the magnetisable layer and the magnetic head or the magnetic field sensor can be used in a control circuit 32, which can operate either analog or digitally, in order to adjust the distance between the magnetisable layer and the magnetic head or the magnetic field sensor.

Figure 3:
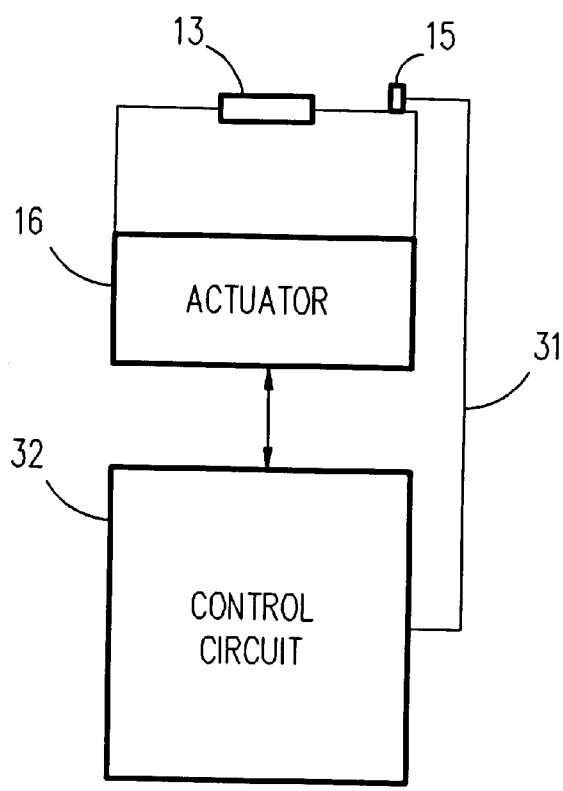
FIG. 3 illustrates that the measured signal from the ranging sensors for measuring the distance between the magnetizable layer and the magnetic field sensor can be used with a control circuit in order to adjust the distance between the magnetizable layer and the magnetic field sensor.

FIG. 3 illustrates that the measured signal 31 from the ranging sensor 15 for measuring the distance between the magnetizable layer and the magnetic field sensor 13 can be used with a control circuit 32 in order to adjust the distance between the magnetizable layer and the magnetic field sensor.

The measurement process described leads to more precise results, since the sources of error which arise during an inductive, dynamic measuring process, such as, for example, the imprecise determination of the magnetisable area during the relative movement of layer/layer carrier and magnetic head/magnetic field sensor, or eddy current effects when the magnetic field is increased, will be avoided. The high relative speed of the specimen and measuring system required with dynamic measurements to obtain good measurement results, but which can easily lead to the destruction of these elements, is unnecessary in this case.

We claim:

1. A method for the direct determination of characteristic magnetic values of thin layers, comprising the steps of:

magnetizing a portion of a thin layer with a magnetizing element of a measurement system while the magnetizing element is stationary at a first position with respect to the thin layer to create a magnetic field;

moving the measurement system to position a magnetic field sensor over the magnetized portion of the thin layer at the first position and removing the magnetizing element from the first position so that the magnetic field sensor occupies the same position previously occupied by the magnetizing element;

measuring the external field strength of the magnetized portion by the magnetic field sensor while the magnetic field sensor is stationary with respect to the magnetized portion; and measuring a distance from the magnetic field sensor to the thin layer.

2. The method of claim 1, further comprising the steps of:

increasing the magnetization of the magnetic field created by the magnetizing element; and repeating the magnetizing, positioning and measuring steps.

3. The method of claim 1, wherein the magnetizing element creating the magnetic field is a magnetic head, an induction cup magnet, a horseshoe magnet, or a solenoid.

4. The method of claim 1, wherein the magnetic field sensor is a magneto-resistive sensor, FLUXGATE sensor, Hall sensor, or magneto-optic sensor.

5. The method of claim 1, further comprising the initial step of:

imposing a magnetic field perpendicular to the direction of measurement on the magnetic field sensor to set a selected degree of pre-magnetization in the magnetic field sensor prior to measuring the magnetization.

6. The method of claim 1, wherein the magnetic field sensor is positioned opposite the magnetized portion of the surface of the thin magnetizable layer by a translational or rotational relative movement of the magnetic field sensor with respect of the thin magnetizable layer.

7. The method of claim 1, wherein the step of measuring a distance uses a ranging sensor which is capacitive, inductive or optical.

8. The method of claim 7, further comprising the step of:

controlling the distance between the magnetic field sensor and the thin magnetizable layer using a control circuit with output from the ranging sensor.

9. The method of claim 8, wherein the control circuit is analog or digital.

10. The method of claim 7, wherein the ranging sensor, the magnetizing element, and the magnetic field sensor are secured to an actuator.

11. An apparatus for determining characteristic magnetic values of a thin layer, comprising:

a measuring system including a magnetic head and a magnetic field sensor;

means for magnetizing a portion of a thin layer using the magnetic head to apply a magnetic field to the portion of the thin layer while the magnetic head is stationary at a selected position with respect to the thin layer;

means for moving the measuring system to position the magnetic field sensor over the magnetized portion of the thin layer at the selected position and moving the magnetic head away from the selected position so that the magnetic field sensor occupies the same position previously occupied by the magnetizing element;

means for measuring an external magnetic field strength using the magnetic field sensor while stationary with respect to the magnetized portion of the thin layer; and a range sensor which measures a distance separating the magnetic field sensor and the thin layer.

12. The apparatus of claim 11, further comprising a coil positioned to apply a magnetic field to the magnetic field sensor to set a selected level of magnetization in the magnetic field sensor prior to measuring.

13. The apparatus of claim 11, further comprising:

means for increasing the magnetization of the magnetic field applied by the magnetizing element; and means for repeating said magnetizing, positioning and measuring steps.

* * * * *

UNITED STATES PATENT AND TRADEMARK OFFICE
CERTIFICATE OF CORRECTION

PATENT NO. : 5,917,321
DATED : June 29, 1999
INVENTOR(S) : P. Pokrowsky et al.

It is certified that error appears in the above-identified patent and that said Letters Patent is hereby corrected as shown below:

<u>Title page,</u>
Item [73] Assignee, add the following as additional Assignee:

IMM Institut Fur Mikrotechnik GmbH,
    Mainz-Hechtsheim, Germany

Signed and Sealed this

Twenty-sixth Day of February, 2002

*Attest:*

JAMES E. ROGAN
*Attesting Officer*    *Director of the United States Patent and Trademark Office*